US010319667B2

(12) United States Patent
Miyahara et al.

(10) Patent No.: US 10,319,667 B2
(45) Date of Patent: Jun. 11, 2019

(54) ELECTRONIC DEVICE AND METHOD OF FABRICATING THE SAME

(71) Applicant: FUJITSU LIMITED, Kawasaki-shi, Kanagawa (JP)

(72) Inventors: Shoichi Miyahara, Kawasaki (JP); Aki Dote, Isehara (JP); Hideki Kitada, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/642,284

(22) Filed: Jul. 5, 2017

(65) Prior Publication Data
US 2018/0061740 A1    Mar. 1, 2018

(30) Foreign Application Priority Data
Aug. 24, 2016 (JP) ................................. 2016-164051

(51) Int. Cl.
| H01L 23/48 | (2006.01) |
| H01L 23/532 | (2006.01) |
| H01L 21/768 | (2006.01) |
| H01L 21/285 | (2006.01) |
| H01L 25/065 | (2006.01) |

(52) U.S. Cl.
CPC ........ *H01L 23/481* (2013.01); *H01L 21/2855* (2013.01); *H01L 21/28556* (2013.01); *H01L 21/76898* (2013.01); *H01L 23/53228* (2013.01); *H01L 25/0657* (2013.01); *H01L 2224/16145* (2013.01); *H01L 2225/06541* (2013.01)

(58) Field of Classification Search
CPC ............. H01L 23/481; H01L 23/53228; H01L 25/0657; H01L 2225/06541
See application file for complete search history.

(56) References Cited

U.S. PATENT DOCUMENTS

| 2002/0190348 | A1 | 12/2002 | Anma | |
| 2004/0080040 | A1* | 4/2004 | Dotta | H01L 21/76898 257/698 |
| 2010/0096723 | A1* | 4/2010 | Tsuda | H01L 23/5256 257/529 |
| 2011/0006303 | A1* | 1/2011 | Muta | G01R 31/2853 257/48 |
| 2011/0297430 | A1* | 12/2011 | Sunohara | H05K 3/4605 174/257 |
| 2013/0285055 | A1* | 10/2013 | Takayanagi | H01L 22/34 257/48 |

FOREIGN PATENT DOCUMENTS

JP    2003-007821    1/2003

OTHER PUBLICATIONS

Machine English Translation of JP 06-050824; Toshiaki H., published Feb. 25, 1994.*

* cited by examiner

*Primary Examiner* — Peniel M Gumedzoe
(74) *Attorney, Agent, or Firm* — Fujitsu Patent Center

(57) ABSTRACT

An electronic device includes: a substrate that includes a first penetration hole; a first electrode that is located on a first surface of the substrate so as to cover the first penetration hole; and a first penetrating electrode that is located in the first penetration hole and is in contact with or away from the first electrode depending on temperature.

12 Claims, 14 Drawing Sheets

US 10,319,667 B2

ELECTRONIC DEVICE AND METHOD OF FABRICATING THE SAME

CROSS-REFERENCE TO RELATED APPLICATION

This application is based upon and claims the benefit of priority of the prior Japanese Patent Application No. 2016-164051 filed on Aug. 24, 2016, the entire contents of which are incorporated herein by reference.

FIELD

A certain aspect of the embodiments is related to an electronic device and a method of fabricating the same.

BACKGROUND

In electronic devices such as semiconductor devices, used are penetrating electrodes located in penetration holes penetrating through an insulating layer or a substrate. It has been known to form an anti-fuse with use of the penetrating electrode in the penetration hole as disclosed in, for example, Japanese Patent Application Publication No. 2003-7821.

SUMMARY

According to a first aspect of the embodiments, there is provided an electronic device including: a substrate that includes a first penetration hole; a first electrode that is located on a first surface of the substrate so as to cover the first penetration hole; and a first penetrating electrode that is located in the first penetration hole and is in contact with or away from the first electrode depending on temperature.

According to a second aspect of the embodiments, there is provided a method of fabricating an electronic device, the method including: forming a first penetration hole and a second penetration hole in a substrate so that the first penetration hole is in contact with a first electrode and the second penetration hole is in contact with a second electrode, the first electrode and the second electrode being located on a first surface of the substrate, the second penetration hole having a diameter greater than a diameter of the first penetration hole; forming a seed layer in the first penetration hole and the second penetration hole so that the seed layer is not in contact with the first electrode and is in contact with the second electrode; and forming a first penetrating electrode in the first penetration hole and a second penetrating electrode in the second penetration hole by plating using the seed layer as a seed, the first penetrating electrode being in contact with or away from the first electrode depending on temperature, the second penetrating electrode being in contact with the second electrode through the seed layer at any temperature.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Measuring the temperature in the electronic device may be required. If a detection element for detecting temperature, a circuit for driving the detection element, and a circuit for processing output of the detection element are provided to measure temperature, the circuit size increases.

Hereinafter, a description will be given of embodiments with reference to the accompanying drawings.

First Embodiment

Figure 1:
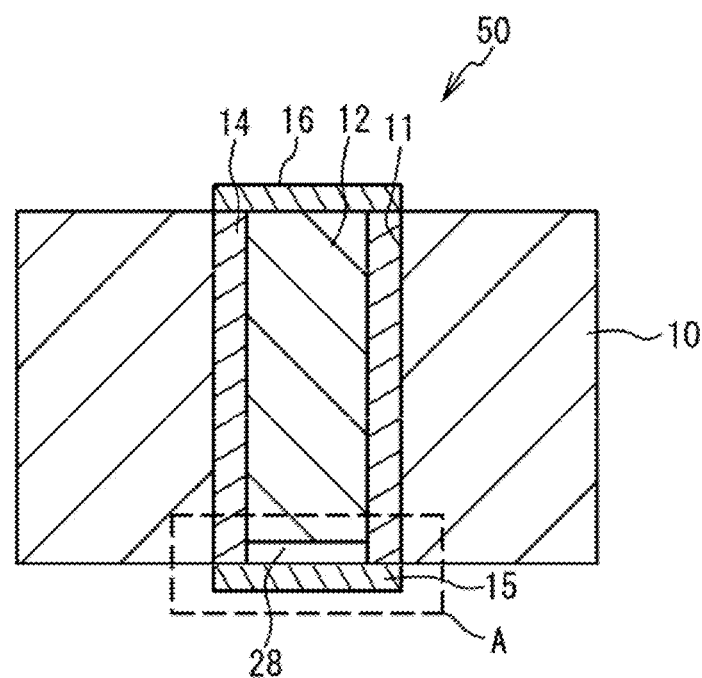
FIG. 1 is a cross-sectional view of an electronic device in accordance with a first embodiment.

FIG. 1 is a cross-sectional view of an electronic device in accordance with a first embodiment. As illustrated in FIG. 1, a temperature switch 50 includes a penetration hole 11 vertically penetrating through a substrate 10. An insulating film 14 is located on the side surface of the penetration hole 11. A penetrating electrode 12 is embedded in the inside of the insulating film 14. An electrode 15 is located on the lower surface of the substrate 10, and an electrode 16 is located on the upper surface of the substrate 10. The penetrating electrode 12 is in contact with the electrode 16, and is away from the electrode 15 across an air gap 28.

The substrate 10 is, for example, a semiconductor substrate such as a silicon (Si) substrate, or an insulating substrate such as a resin substrate or a ceramic substrate. The substrate 10 may be an interlayer insulating film located on a semiconductor substrate. The penetrating electrode 12 and the electrodes 15 and 16 are formed of a metal layer such as, for example, a copper (Cu) layer, a gold (Au) layer, or an aluminum (Al) layer. The penetrating electrode 12 has a larger linear thermal expansion coefficient than the substrate 10. The insulating film 14 is, for example, a silicon oxide film, a silicon nitride film, or a silicon oxynitride film. The insulating film 14 is a film for insulating the substrate 10 from the penetrating electrode 12. When the substrate 10 is an insulating substrate, the insulating film 14 may not be necessarily provided. When the substrate 10 is a semiconductor substrate or the like and has electrical conductivity, an insulating film is preferably located between the electrodes 15 and 16 and the substrate 10.

Figure 2A:
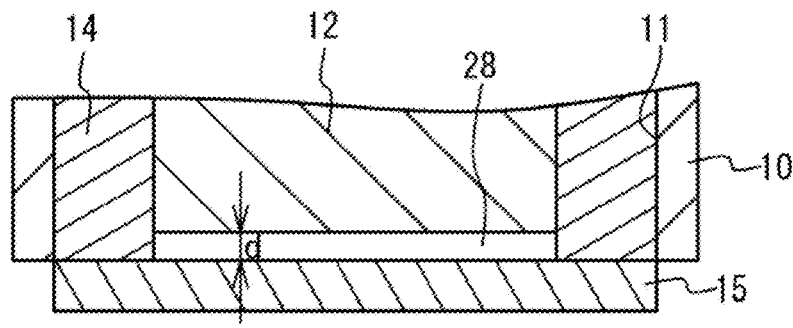
FIG. 2A and FIG. 2B are enlarged views of an area A in FIG. 1.
Figure 2B:
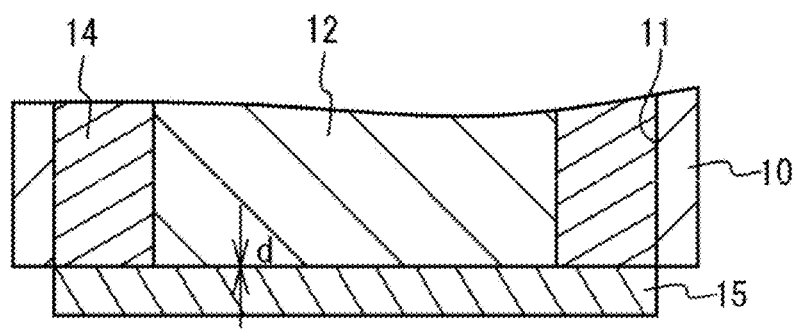
Figure 2C:
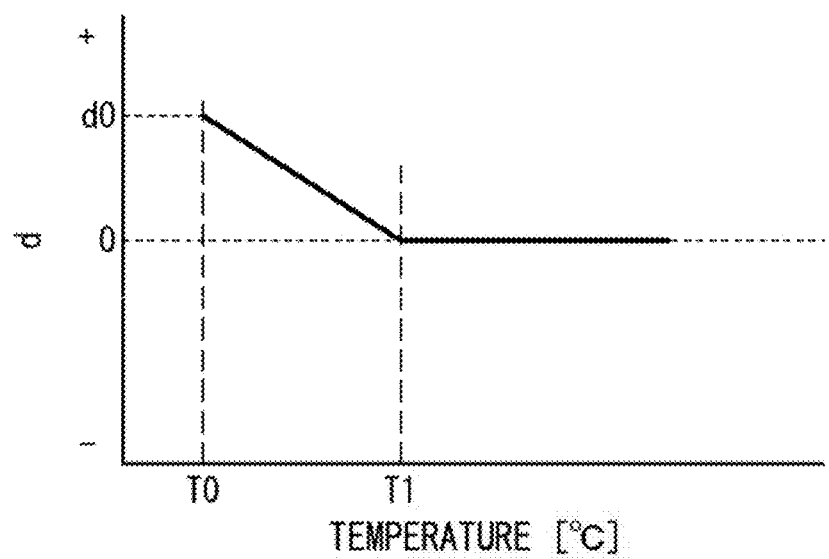
FIG. 2C is a graph of distance d versus temperature.

FIG. 2A and FIG. 2B are enlarged views of an area A in FIG. 1, and FIG. 2C is a graph of distance d versus temperature. As illustrated in FIG. 2A, the air gap 28 is formed between the electrode 15 and the penetrating electrode 12 at room temperature. The air gap 28 is, for example, an air layer. The distance between the electrode 15 and the penetrating electrode 12 is represented by "d". As illustrated in FIG. 2C, the distance d at room temperature T0 is d0. As the temperature increases, the penetrating electrode 12 expands compared to the substrate 10. Thus, the distance d decreases. When the temperature becomes a certain temperature T1 or greater, the distance d becomes 0, and the penetrating electrode 12 is in contact with the electrode 15 as illustrated in FIG. 2B. As illustrated in FIG. 2C, at a temperature equal to or greater than the temperature T1, the distance d is 0. As described above, at a temperature less than the temperature T1, the electrode 15 is away from the penetrating electrode 12. Thus, the electrodes 15 and 16 are not electrically interconnected. Accordingly, the temperature switch 50 is off. At a temperature equal to or greater than the temperature T1, the electrode 15 and the penetrating electrode 12 are in contact with each other. Thus, the electrodes 15 and 16 are electrically interconnected. Accordingly, the temperature switch 50 is on. As described above, the temperature switch 50 is off at a temperature less than the certain temperature T1, and is on at a temperature equal to or greater than the certain temperature T1.

Figure 3:
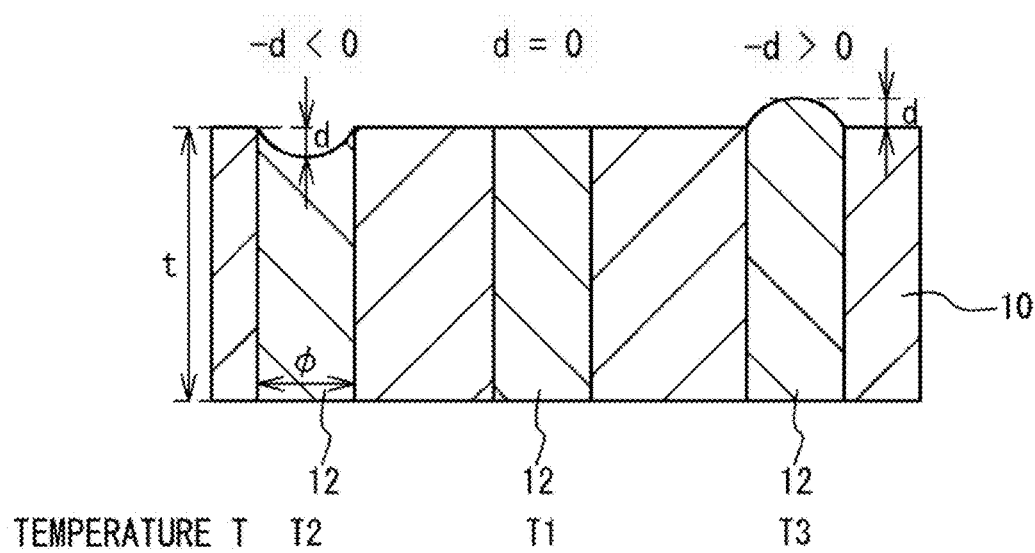
FIG. 3 schematically illustrates a simulation in the first embodiment.

The deformation of the penetrating electrode 12 with respect to the temperature was simulated with a finite element method. FIG. 3 schematically illustrates a simulation in the first embodiment. As illustrated in FIG. 3, the substrate 10 was assumed to be a silicon substrate, and the penetrating electrode 12 was assumed to be formed of a copper layer. Silicon has a linear thermal expansion coefficient of 2.3 ppm, and copper has a linear thermal expansion coefficient of 16.6 ppm. The penetrating electrode 12 was assumed to have a diameter φ of 10 μm, and the substrate 10 was assumed to have a thickness t of 50 μm. When the temperature T is T1, the upper surface of the penetrating electrode 12 is flat. The distance d at the time of deformation when the upper surface of the penetrating electrode 12 is flat was defined as 0. When the temperature is T2 lower than T1, the upper surface of the penetrating electrode 12 bends down. The distance d between the lowest point of the upper surface of the penetrating electrode 12 and the upper surface of the substrate 10 when the upper surface of the penetrating electrode 12 bends down was defined to be positive (i.e., −d<0). At a temperature T3 greater than the temperature T1, the upper surface of the penetrating electrode 12 bulges out. The distance d between the highest point of the upper surface of the penetrating electrode 12 and the upper surface of the substrate 10 was defined to be negative (i.e., −d>0).

Figure 4A:
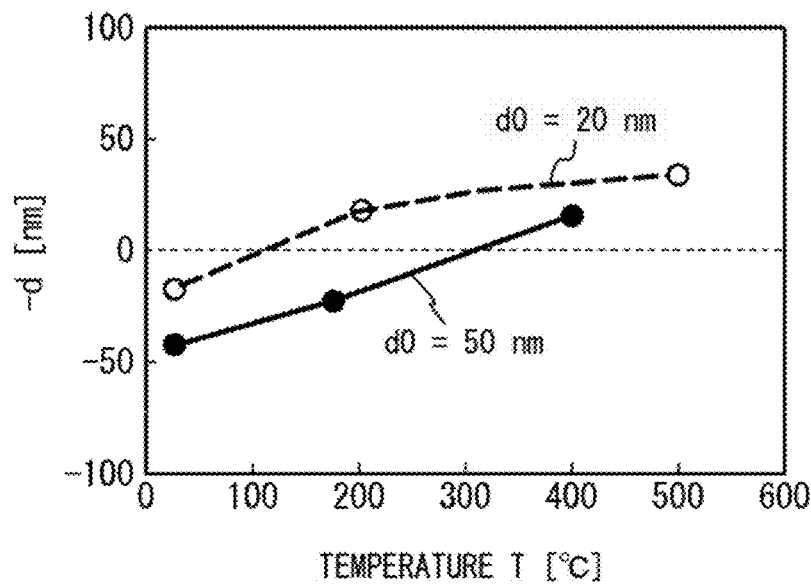
FIG. 4A illustrates simulation results of the distance d at the time of deformation with respect to temperature in the first embodiment, and FIG. 4B schematically illustrates a relation between resistance and temperature.
Figure 4B:
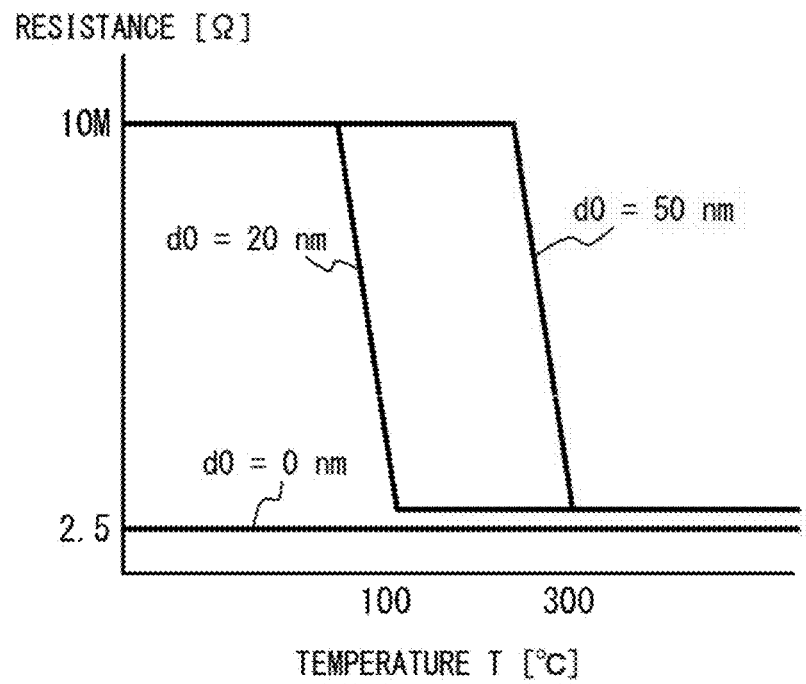

FIG. 4A illustrates simulation results of the distance d at the time of deformation with respect to temperature in the first embodiment, and FIG. 4B schematically illustrates a relation between resistance and temperature. In FIG. 4A, black circles indicate simulation results when the distance d0 is 50 nm at room temperature (25° C.), and open circles indicate simulation results when distance d0 is 20 nm at room temperature (25° C.). The vertical axis represents −d. The solid line and the dashed line are approximate curves. When the distance d0 is 20 nm and 50 nm, the temperature at which d becomes 0 is approximately 100° C. and approximately 300° C., respectively. As seen above, the temperature at which d becomes 0 can be set by using the distance d0 at room temperature.

In FIG. 4B, it is assumed that the penetrating electrode 12 and the electrode 15 come in contact with each other when d becomes 0, and the resistance between the electrodes 15 and 16 in FIG. 1 with respect to the temperature is schematically illustrated. As illustrated in FIG. 4B, when the distance d0 at room temperature is 0, the penetrating electrode 12 and the electrode 15 remain in contact with each other even when the temperature increases. Thus, the state between the electrodes 15 and 16 is an on state, and the resistance is, for example, 2.5Ω. When d0 is 20 nm and 50 nm, the state between the electrodes 15 and 16 at room temperature is an off state, and the resistance is, for example, 10M Ω. When d0 is 20 nm, the penetrating electrode 12 and the electrode 15 come in contact with each other at a temperature around 100° C. Thus, the resistance decreases to approximately 2.5Ω. When d0 is 50 nm, the resistance decreases to approximately 2.5Ω at a temperature around 300° C. As described above, the temperature at which the switch is turned on or off can be adjusted by the distance d0.

First Variation of First Embodiment

The description of FIG. 2A through FIG. 4B describes an exemplary case where the linear thermal expansion coefficient of the substrate 10 is less than that of the penetrating electrode 12, but the linear thermal expansion coefficient of the substrate 10 may be greater than that of the penetrating electrode 12. For example, a resin such as an epoxide-based resin is used as the substrate 10. The epoxide-based resin has a linear thermal expansion coefficient of, for example, 67 ppm. When the penetrating electrode 12 is made of copper, the linear thermal expansion coefficient of the substrate 10 is greater than that of the penetrating electrode 12. In this case, d is 0 at room temperature T0, and d is greater than 0 at high temperature in FIG. 2C. Thus, a temperature switch that is on at a temperature less than a certain temperature and is off at a temperature equal to or greater than the certain temperature can be made.

In the first embodiment, the penetration hole 11 (a first penetration hole) is located in the material 10. The electrode 15 (a first electrode) is in contact with the penetration hole 11, and is located on the lower surface (a first surface) of the substrate 10. The penetrating electrode 12 (a first penetrating electrode) is located in the penetration hole 11, and is in contact with or away from the electrode 15 depending on the temperature. Therefore, a temperature switch can be made in an electronic device with use of a simple structure.

The penetrating electrode 12 is away from the electrode 15 at a temperature less than the certain temperature T1, and is in contact with the electrode 15 at a temperature equal to or greater than the certain temperature T1. Alternatively, the penetrating electrode 12 is in contact with the electrode 15 at a temperature less than the certain temperature T1, and is away from the electrode 15 at a temperature equal to or greater than the certain temperature T1. Accordingly, a temperature switch can be made in an electronic device by using a simple structure.

When the penetrating electrode 12 has a higher linear thermal expansion coefficient than the substrate 10, a temperature switch that is on at a high temperature is made. When the penetrating electrode 12 has a lower linear thermal expansion coefficient than the substrate 10, a temperature switch that is off at a high temperature is made.

Second Embodiment

Figure 5:
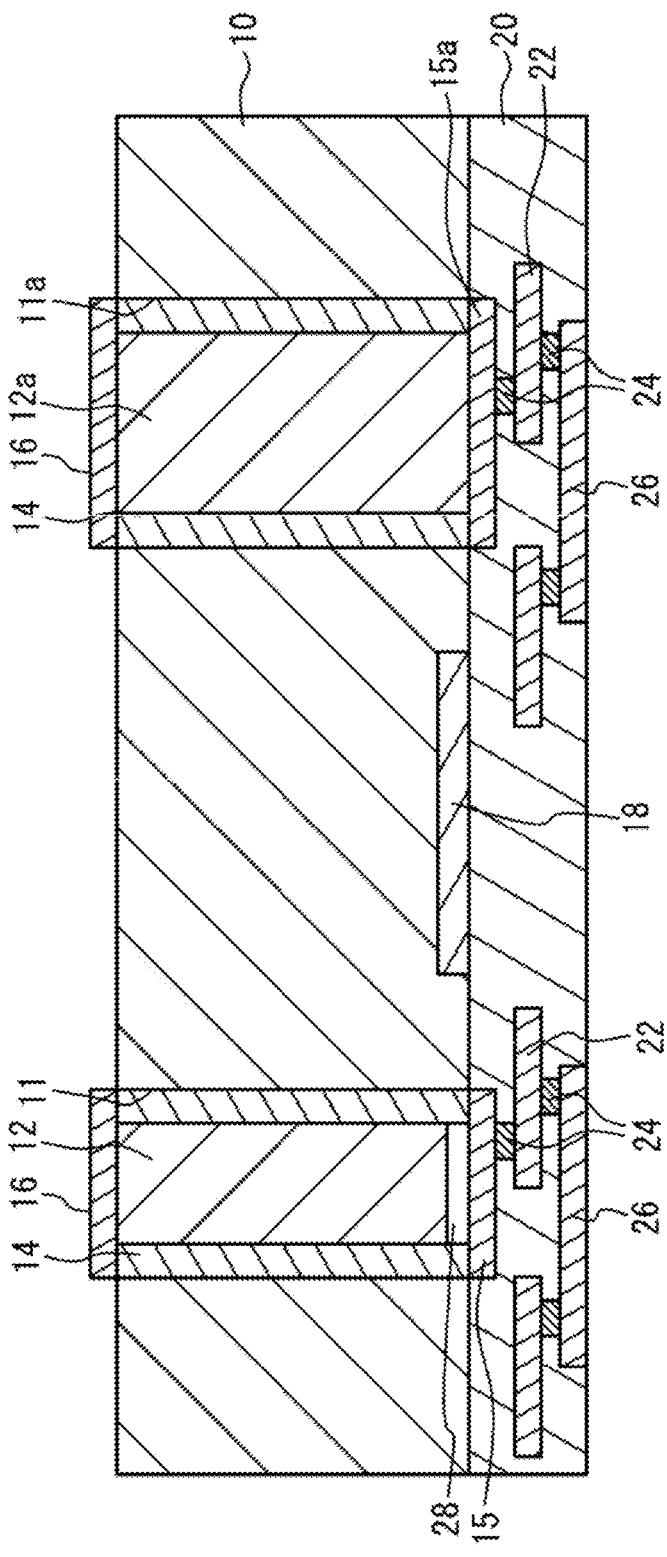
FIG. 5 is a cross-sectional view of an electronic device in accordance with a second embodiment.

A second embodiment uses a silicon substrate for the substrate 10 and a Through-Silicon Via (TSV) for the penetrating electrode 12. FIG. 5 is a cross-sectional view of an electronic device in accordance with the second embodiment. As illustrated in FIG. 5, penetration holes 11 and 11a are formed in the substrate 10. The substrate 10 is a silicon substrate, and has a thickness of 50 The penetration hole 11a has a greater diameter than the penetration hole 11. The diameters of the penetration holes 11 and 11a are respectively 8 µm and 10 µm. The insulating film 14 is a silicon oxide film, and has a film thickness of 0.1 µm. Penetrating electrodes 12 and 12a are respectively embedded in the penetration holes 11 and 11a.

Electrodes 15 and 15a are formed of pads of a Back End of Line (BEOL), and the electrode 16 is formed of a pad of a Redistribution Line (RDL). The electrodes 15, 15a, and 16 have film thicknesses of, for example, 4 µm. The penetrating electrodes 12 and 12a and the electrodes 15, 15a, and 16 are formed of a copper layer. The penetrating electrode 12 is in contact with the electrode 15 at a temperature equal to or greater than the temperature T1, and is away from the electrode 15 at a temperature less than the temperature T1. The penetrating electrode 12a is in contact with the electrode 15a at any temperature. The penetrating electrodes 12 and 12a are in contact with the electrodes 16 at any temperature. The penetrating electrode 12 functions as a temperature switch. The penetrating electrode 12a functions as, for example, a power source TSV, a ground TSV, a signal TSN, or a thermal via TSV.

An active part 18 is formed on the lower surface of the substrate 10. In the active part 18, a transistor and the like are formed. Various circuits are formed by a transistor and a wiring line. An insulating layer 20 is located on the lower surface of the substrate 10. Wiring lines 22 and via wirings 24 are formed in the insulating layer 20. Lands 26 are located on the lower surface of the insulating layer 20. The electrode 15 and the land 26 are electrically connected through the wiring line 22 and the via wirings 24. The insulating layer 20 is formed of, for example, a silicon oxide film. The wiring lines 22, the via wirings 24, and the lands 26 are formed of a metal layer made of, for example, copper.

Figure 6A:
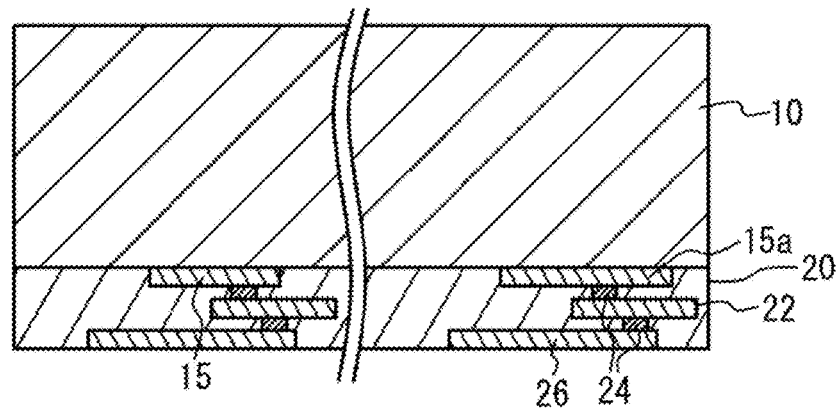
FIG. 6A through FIG. 6C are cross-sectional views (No. 1) illustrating a method of fabricating the electronic device in accordance with the second embodiment.
Figure 6B:
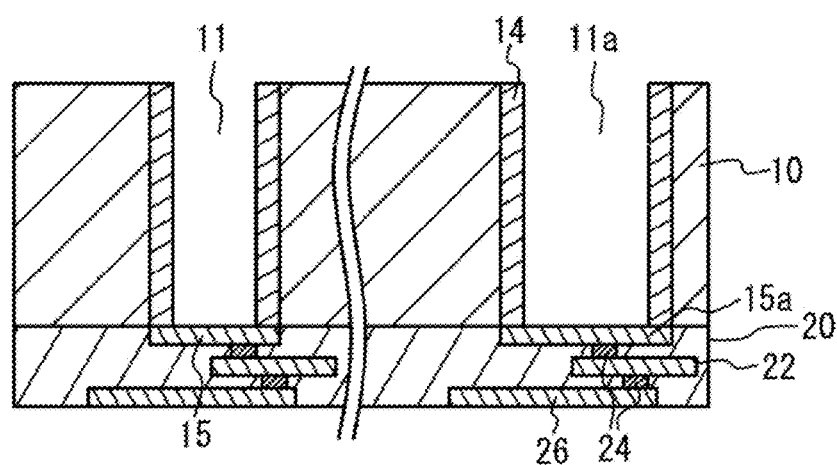
Figure 6C:
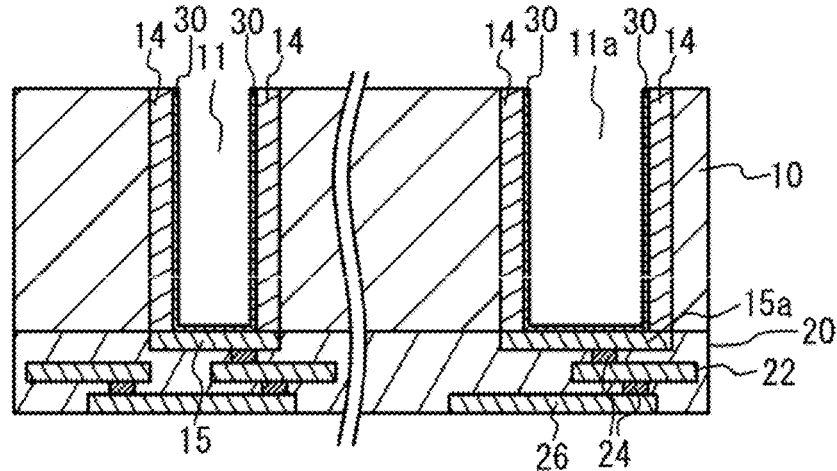

A method of fabricating the electronic device of the second embodiment will be described. FIG. 6A through FIG. 7C are cross-sectional views illustrating a method of fabricating the electronic device in accordance with the second embodiment. As illustrated in FIG. 6A, the electrodes 15 and 15a, the insulating layer 20, the wiring lines 22, the via wirings 24, and the lands 26 are formed on the lower surface of the substrate 10. As illustrated in FIG. 6B, the penetration holes 11 and 11a penetrating through the substrate 10 from the upper surface of the substrate 10 are formed. The penetration hole 11a has a greater diameter than the penetration hole 11. The insulating films 14 are formed on the side surfaces of the penetration holes 11 and 11a. As illustrated in FIG. 6C, adhesive layers 30 are formed on the side surfaces of the insulating films 14 and the upper surfaces of the electrodes 15 and 15a. The adhesive layer 30 is formed of, for example, a titanium film with a film thickness of 20 nm, and is formed by sputtering. The adhesive layer 30 may be formed on the upper surface of the electrode 15a, and may not be necessarily formed on the upper surface of the electrode 15.

Figure 7A:
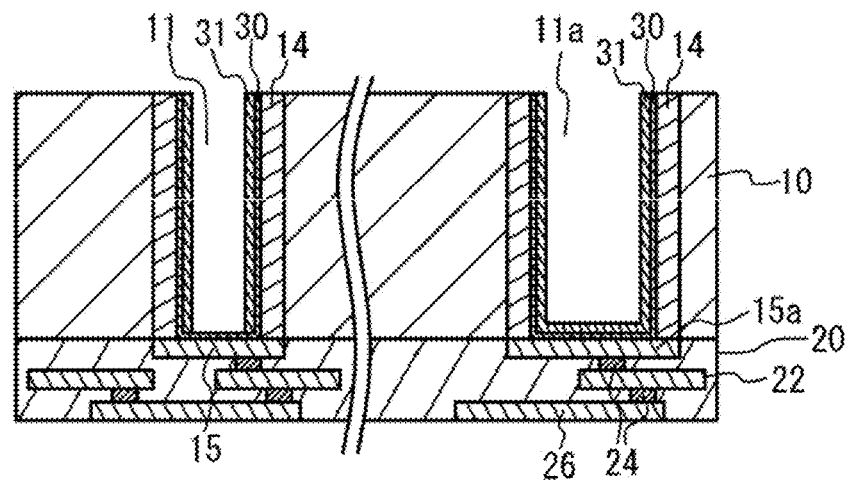
FIG. 7A through FIG. 7C are cross-sectional views (No. 2) illustrating the method of fabricating the electronic device in accordance with the second embodiment.

As illustrated in FIG. 7A, seed layers 31 are formed on the inner surfaces of the adhesive layers 30. The seed layer 31 is formed of, for example, a copper film with a film thickness of 200 nm, and is formed by sputtering. The film thicknesses of the adhesive layer 30 and the seed layer 31 are the film thicknesses on the upper surface of the substrate 10. When high frequency power in sputtering is reduced, the bottom coverage of the seed layer 31 decreases. In the penetration hole 11a with a larger diameter, the seed layer 31 is formed on the side surface of the penetration hole 11a and the upper surface of the electrode 15a. In the penetration hole 11 with a smaller diameter, the seed layer 31 is formed on the side surface of the penetration hole 11, but is not formed on the upper surface of the electrode 15.

Figure 7B:
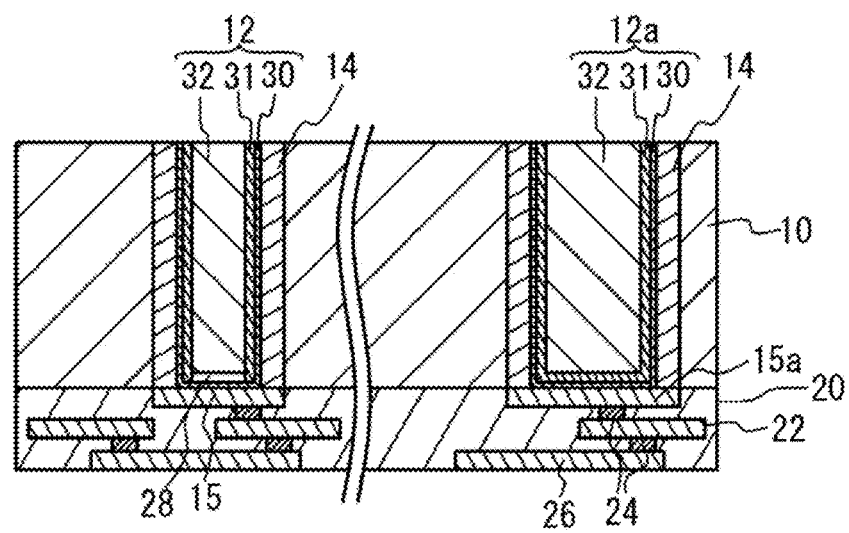
Figure 7C:
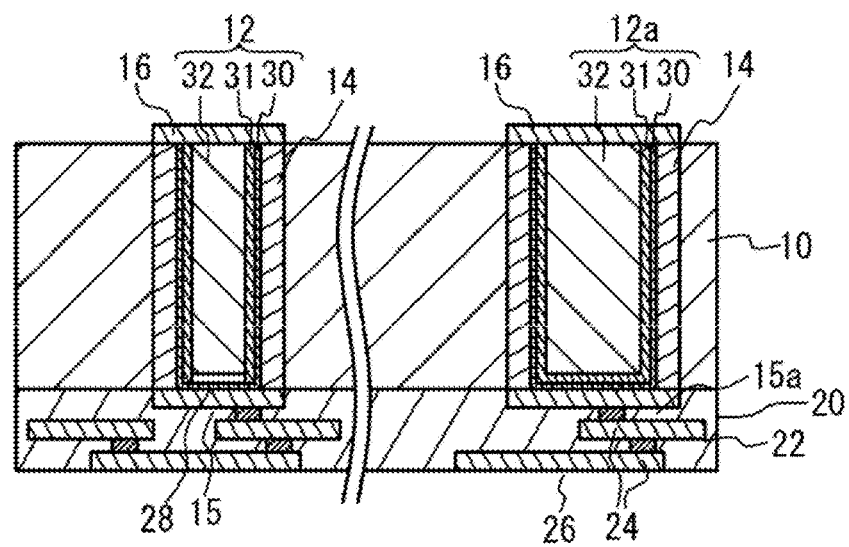

As illustrated in FIG. 7B, by supplying electric current to the seed layer 31, plated layers 32 are formed in the penetration holes 11 and 11a by electrolytic plating. In the penetration hole 11, the seed layer 31 is not formed on the upper surface of the electrode 15. Thus, the plated layer 32 is not formed on the adhesive layer 30. Thus, the air gap 28 is formed between the plated layer 32 and the electrode 15. In the penetration hole 11a, the seed layer 31 is formed on the upper surface of the electrode 15a. Thus, the plated layer 32 and the electrode 15a are in contact with each other. As illustrated in FIG. 7C, the electrode 16 is formed on the upper surface of the substrate 10.

Figure 8A:
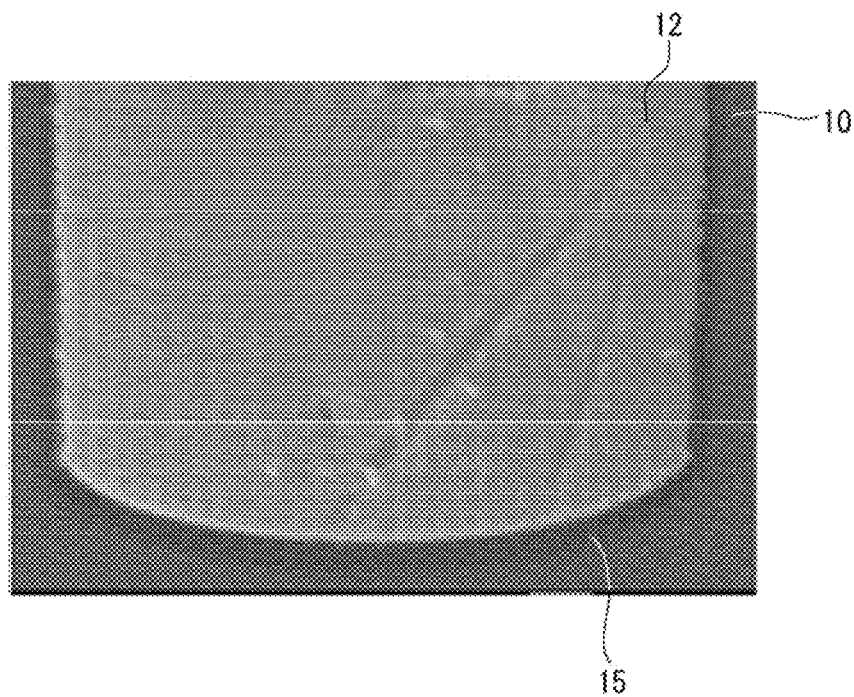
FIG. 8A and FIG. 8B are SEM images of fabricated penetrating electrodes.
Figure 8B:
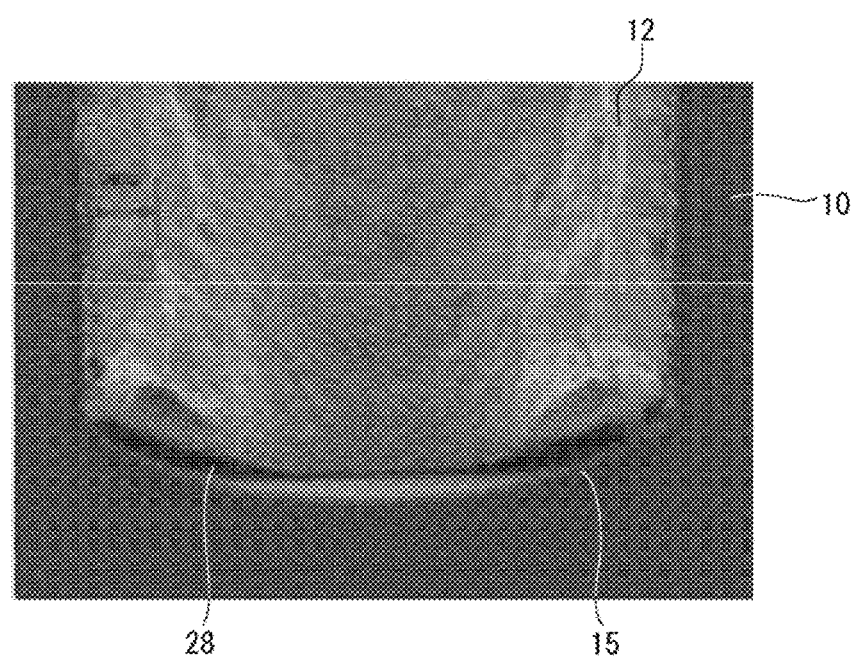

FIG. 8A and FIG. 8B are Scanning Electron Microscope (SEM) images of fabricated penetrating electrodes. In FIG. 8A, the penetrating electrode 12 had a diameter φ of 10 µm, and the high frequency power at the time of sputtering the seed layer 31 in FIG. 7A was 500 W. The adhesive layer 30 and the seed layer 31 on the electrode 15 after sputtering respectively had film thicknesses of 5 nm and 70 nm. As illustrated in FIG. 8A, the penetrating electrode 12 and the electrode 15 are in contact with each other. In FIG. 8B, the penetrating electrode 12 had a diameter φ of 8 µm, and the high frequency power at the time of sputtering the seed layer 31 in FIG. 7A was 200 W. The seed layer 31 was not formed on the electrode 15. As illustrated in FIG. 8B, the air gap 28 is formed between the penetrating electrode 12 and the electrode 15. As described above, the air gap 28 can be formed between the penetrating electrode 12 and the electrode 15 by changing the sputtering condition of the seed layer 31.

In the second embodiment, as illustrated in FIG. 6B, the penetration holes 11 and 11a are formed in the substrate 10 so as to be respectively in contact with the electrode 15 (a first electrode) and the electrode 15a (a second electrode) located on the lower surface of the substrate 10 (a first surface). The penetration hole 11a (a second penetration hole) has a greater diameter than the penetration hole 11 (a first penetration hole). As illustrated in FIG. 7A, the seed layer 31 is formed in the penetration hole 11 so as not to be in contact with the electrode 15, and the seed layer 31 is formed in the penetration hole 11a so as to be in contact with the electrode 15a. As illustrated in FIG. 7B, by plating using the seed layer 31 as a seed, the penetrating electrode 12 is formed in the penetration hole 11, and the penetrating electrode 12a being in contact with the electrode 15a through the seed layer 31 at any temperature is formed in the penetration hole 11a.

Therefore, the penetrating electrode 12 functioning as a temperature switch and the penetrating electrode 12 functioning as a normal TSV are formed in the same substrate 10 by using the same fabrication process.

By forming the seed layer 31 by sputtering, the penetrating electrodes 12 and 12a can be formed in the same substrate 10.

First Variation of Second Embodiment

Figure 9:
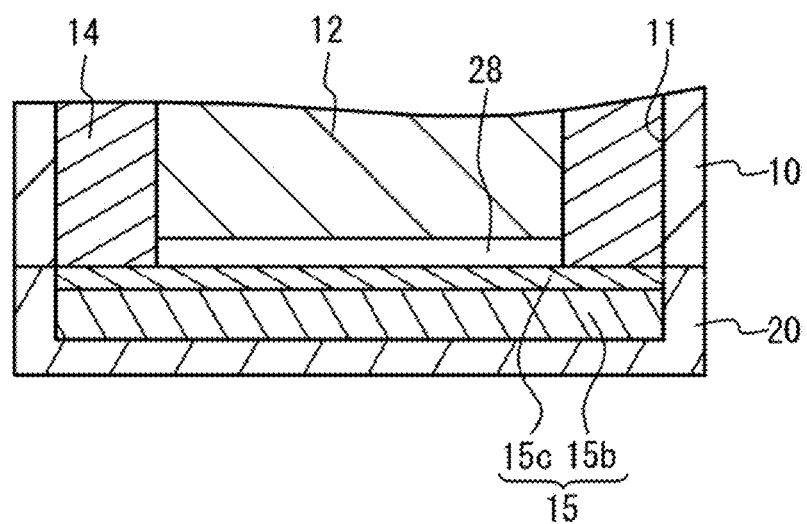
FIG. 9 is a cross-sectional view of an electronic device in accordance with a first variation of the second embodiment.

FIG. 9 is a cross-sectional view of an electronic device in accordance with a first variation of the second embodiment.

As illustrated in FIG. 9, the electrode 15 includes electrode layers 15b and 15c. The electrode layer 15b is a low resistance layer having a lower resistance than the electrode layer 15c. The electrode layer 15c is a layer having a higher melting point than the electrode layer 15b and the penetrating electrode 12. The electrode layer 15c is made of, for example, titanium (Ti), tantalum (Ta), nickel (Ni), tungsten (W), or chrome (Cr). The electrode layer 15c has a film thickness of, for example, 10 to 100 nm.

In the first and second embodiments, the penetrating electrode 12 and the electrode 15 are made of a metal having a low resistance such as copper. Thus, at high temperature, the penetrating electrode 12 and the electrode 15 may be bonded to each other. If the penetrating electrode 12 and the electrode 15 are bonded to each other, the penetrating electrode 12 and the electrode 15 fail to function as a temperature switch.

In the first variation of the second embodiment, the surface, which is in contact with the penetrating electrode 12, of the electrode 15 is a layer having a higher melting point than the penetrating electrode 12. This configuration inhibits the penetrating electrode 12 and the electrode 15 from being bonded at high temperature.

Second Variation of Second Embodiment

Figure 10:
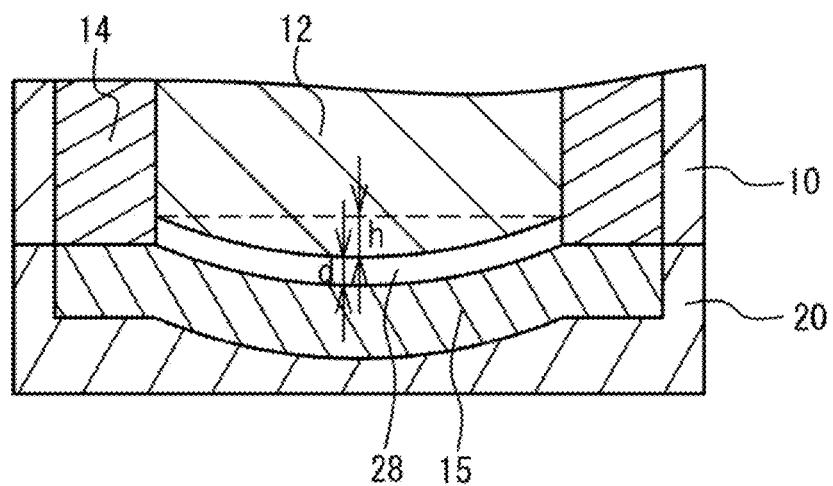
FIG. 10 is a cross-sectional view of an electronic device in accordance with a second variation of the second embodiment.

FIG. 10 is a cross-sectional view of an electronic device in accordance with a second variation of the second embodiment. As illustrated in FIG. 10, the lower surface of the penetrating electrode 12 and the upper surface of the electrode 15 bend downward, and are cone-shaped or dome-shaped. A distance h between the lowest point and the edge of the lower surface of the penetrating electrode 12 is, for example, 1 to 20% of the diameter φ of the penetrating electrode 12. When the diameter φ is 8 μm, the distance h is 1 μm, for example. The distance d of the air gap 28 is, for example, 20 to 50 nm.

In the second variation of the second embodiment, the face along which the penetrating electrode 12 and the electrode 15 are in contact with each other bends outward. This structure increases the area of the face along which the penetrating electrode 12 and the electrode 15 are in contact with each other, thereby making the penetrating electrode 12 and the electrode 15 firmly in contact with each other.

Third Embodiment

Figure 11:
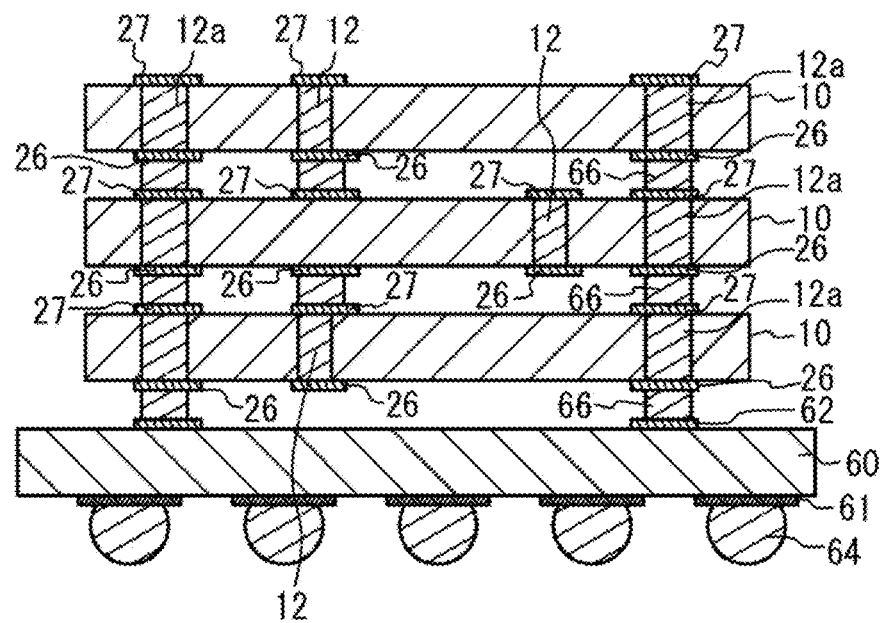
FIG. 11 is a cross-sectional view of an electronic device in accordance with a third embodiment.

A third embodiment is an exemplary three-dimensional mounting in which the substrates of the second embodiment are stacked. FIG. 11 is a cross-sectional view of an electronic device in accordance with the third embodiment. As illustrated in FIG. 11, a plurality of the substrates 10 of the second embodiment are stacked on a wiring board 60. A memory circuit and/or a logic circuit is located in an active layer in the substrate 10. The wiring board 60 is a resin substrate such as a glass epoxy substrate, and includes wiring lines formed thereinside. Lands 61 are located on the lower surface of the wiring board 60, and lands 62 are located on the upper surface of the wiring board 60. Solder balls 64 are located on the lands 61. Bumps 66 are located on the lands 62. The lands 26 are located on the lower surface of each substrate 10, and lands 27 are located on the upper surface of each substrate 10. The lands 26 and 27 are electrically coupled to the penetrating electrodes 12 and 12a via wiring lines. The upper and lower substrates 10 are electrically coupled via the bump 66.

The penetrating electrode 12a functions as a TSV that electrically couples the upper and lower substrates 10. The penetrating electrode 12 functions as a temperature switch that detects the temperature of the substrate 10. As described in the third embodiment, the penetrating electrode 12 of the second embodiment can be applied to a three dimensional mounting electronic device including a plurality of the substrates 10 that are staked.

Fourth Embodiment

Figure 12A:
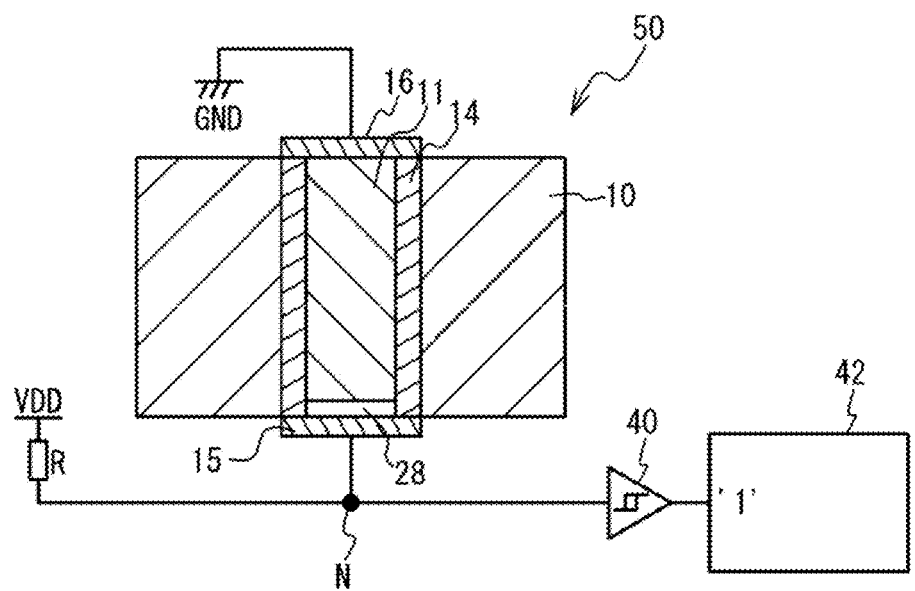
FIG. 12A and FIG. 12B are circuit diagrams of an electronic device in accordance with a fourth embodiment.
Figure 12B:
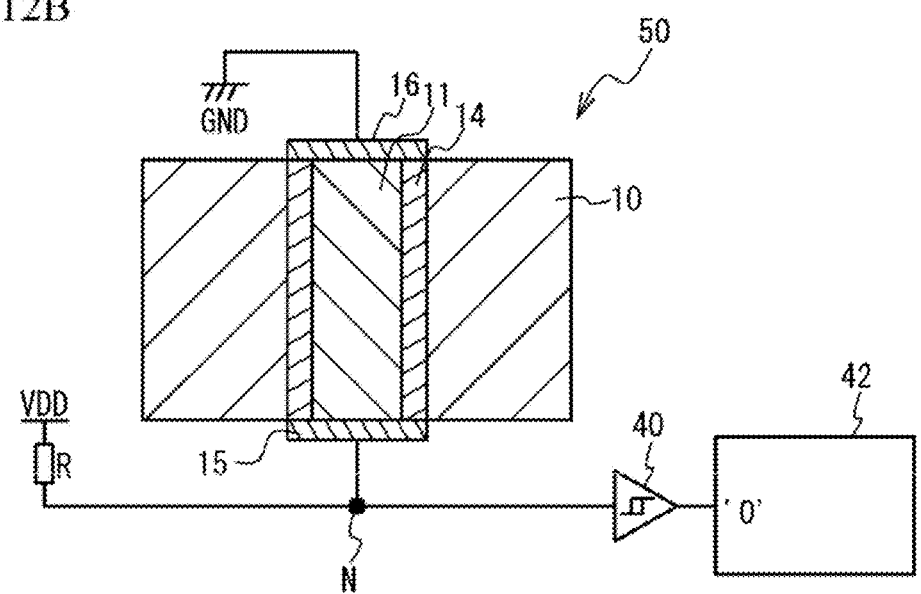

A fourth embodiment is an exemplary detection circuit that detects on and off of a temperature switch. FIG. 12A and FIG. 12B are circuit diagrams of an electronic device in accordance with a fourth embodiment. As illustrated in FIG. 12A and FIG. 12B, the electrode 16 is coupled to a ground GND. The electrode 15 is coupled to a power source VDD through a resistor R. A node N between the electrode 15 and the resistor R is coupled to a control circuit 42 through a schmitt trigger circuit 40. As illustrated in FIG. 12A, when the temperature is low and the temperature switch 50 is therefore off, VDD is applied to the node. Thus, "1" is input to the control circuit 42. As illustrated in FIG. 12B, when the temperature is high and the temperature switch 50 is therefore on, GND is applied to the node N. Thus, "0" is input to the control circuit 42. The schmitt trigger circuit 40 removes noise with a short time constant. As described above, the control circuit 42 detects on/off of the temperature switch. The electrode 15 may be coupled to the ground GND, while the electrode 16 may be coupled to the node N.

Fifth Embodiment

Figure 13:
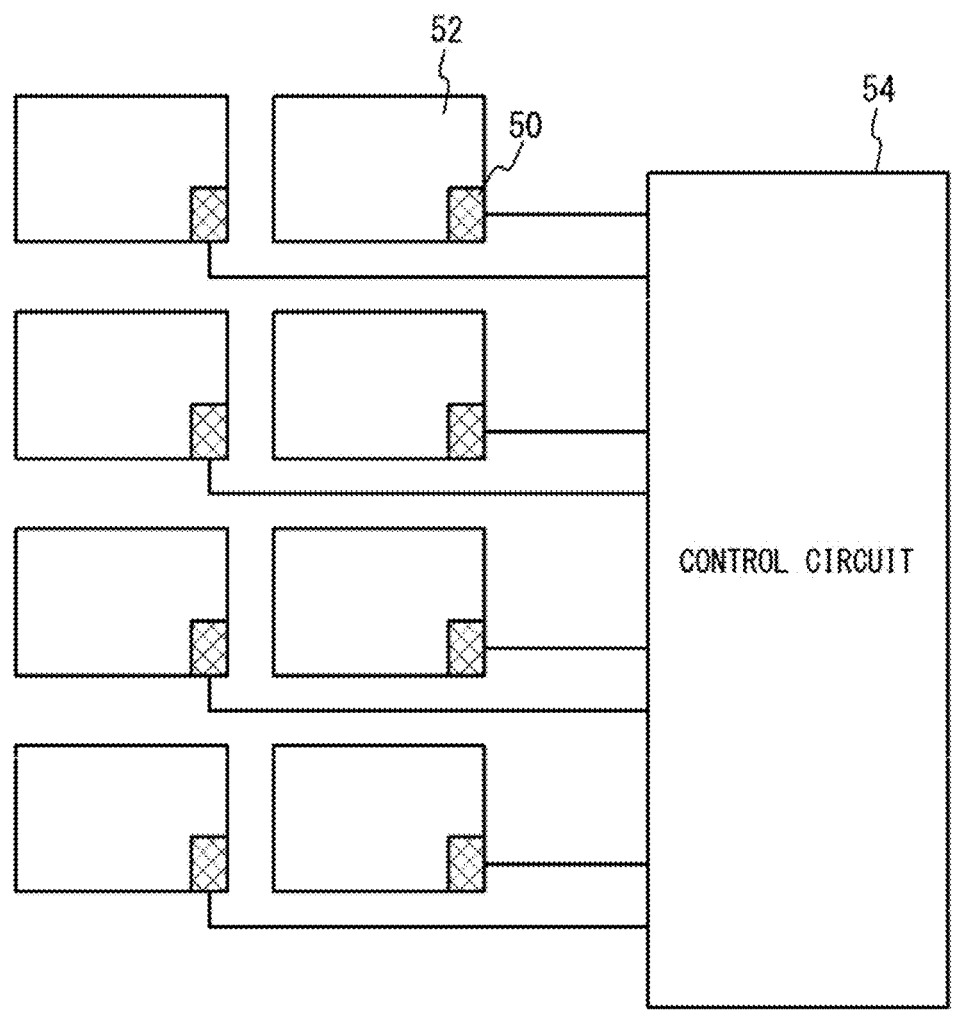
FIG. 13 is a block diagram of an electronic device in accordance with a fifth embodiment.

A fifth embodiment is an exemplary Large Scale Integrated Circuit (LSI). FIG. 13 is a block diagram of an electronic device in accordance with the fifth embodiment. The LSI includes a plurality of cores 52. The temperature switch 50 using the penetrating electrode 12 is located in the core 52. The output of the temperature switch 50 of each core 52 is fed to a control circuit 54. The control circuit 54 controls each core 52 based on the output from the temperature switch 50 of each core 52.

For example, a Central Processing Unit (CPU) or a Graphic Processing Unit (GCU) consumes large electric power. Thus, the control circuit 54 controls each core 52 based on the temperature of each core 52. For example, the control circuit 54 increases the clock frequency of the low-temperature core 52 (the core 52 of which the temperature switch 50 outputs "1"), and decreases the clock frequency of the high-temperature core 52 (the core 52 of which the temperature switch 50 outputs "0") to less than the clock frequency of the low-temperature core 52. Alternatively, for example, when parallel computing is performed, the control circuit 54 does not select the high-temperature core 52, selects the low-temperature core 52, and causes the selected core 52 to execute a process. This control inhibits the temperature of the specific core 52 from becoming high, achieving the higher reliability and longer lifetime of the LSI.

When the temperature switch 50 is not used, the cores 52 are controlled by using a temperature control circuit. In this case, the temperature control circuit includes a temperature detection element, a digital-analog converter circuit (DAC), an analog-digital converter circuit (ADC), a temperature conversion circuit, and a determination circuit. The temperature detection element is, for example, an element, such as a diode, having temperature characteristics. The DAC supplies an accurate analog current to the temperature detection element. The ADC measures the current of the temperature detection element. The temperature conversion circuit converts the output of the ADC into the temperature. The determination circuit compares the converted temperature by the temperature conversion circuit with a reference temperature to determine whether the converted temperature is higher or lower than the reference temperature. As described above, the temperature control circuit becomes a large circuit. On the other hand, the fifth embodiment can make a temperature control circuit with use of a simple structure.

When a plurality of the cores 52 are located on the substrates 10 that are three-dimensionally mounted as in the third embodiment, many cores 52 can be located. However, it is difficult to cool each substrate 10, and thus, the temperature of each core 52 easily increases. Therefore, it is preferable to control the core 52 with use of a temperature switch as described in the fifth embodiment.

Sixth Embodiment

Figure 14:
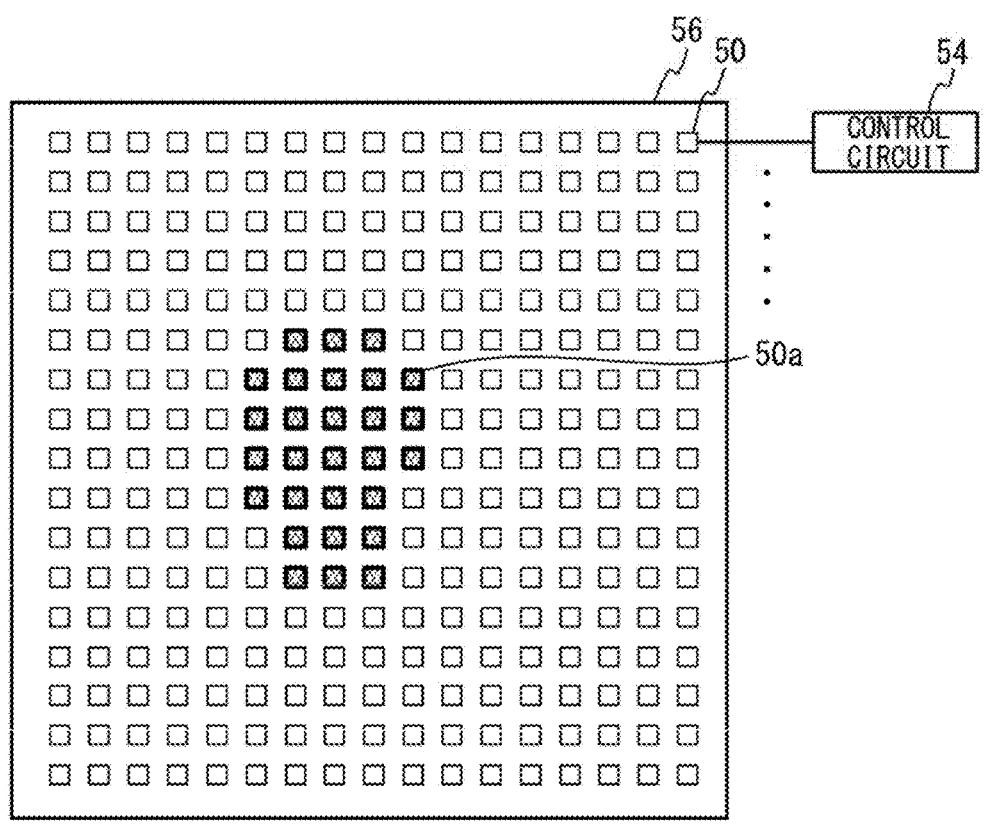
FIG. 14 is a schematic view of an electronic device in accordance with a sixth embodiment.

A sixth embodiment provides many temperature switches in a chip. FIG. 14 is a schematic view of an electronic device in accordance with the sixth embodiment. As illustrated in FIG. 14, many temperature switches 50 each using the penetrating electrode 12 are located across the entire surface of a chip 56 on which an LSI is formed. Temperature switches 50a are temperature switches that are normally on, and the remaining temperature switches 50 are temperature switches that are normally off. In FIG. 14, the temperature switches 50a are located around the center of the chip 56. Accordingly, the control circuit 54 can obtain the temperature distribution in the plane of the chip 56. Therefore, the control circuit 54 can precisely control the temperatures of the cores or other circuits in the chip 56. Alternatively, temperature switches having different temperatures T1 at which the temperature switches are turned on are used as the temperature switches 50. This configuration allows the control circuit 42 to obtain more precise temperature distribution.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An electronic device comprising:
   a substrate that includes a first penetration hole;
   a first electrode that is formed on a first surface of the substrate and covers the first penetration hole;
   a first penetrating electrode that is formed in the first penetration hole and is in contact with or away from the first electrode depending on temperature;
   a second electrode that is formed on the first surface of the substrate and covers a second penetration hole, the second penetration hole being formed in the substrate and having a diameter greater than a diameter of the first penetration hole;
   a second penetrating electrode that is formed in the second penetration hole and is in contact with the second electrode regardless of the temperature; and
   a detection circuit configured to detect whether the first penetrating electrode is in contact with or away from the first electrode.

2. The electronic device according to claim 1, wherein the first penetrating electrode is away from the first electrode at a temperature less than a certain temperature and is in contact with the first electrode at a temperature equal to or greater than the certain temperature.

3. The electronic device according to claim 1, wherein the first electrode comprising:
   a first layer, which is to be in contact with the first penetrating electrode, having a melting point greater than a melting point of the first penetrating electrode; and
   a second layer being formed on the first layer, having a resistivity lower than a resistivity of the first layer and having a melting point less than a melting point of the first layer.

4. The electronic device according to claim 1, wherein a face along which the first electrode and the first penetrating electrode are in contact with each other bends outward so that a center of the face is located further out than the first surface of the substrate.

5. The electronic device according to claim 1, further comprising:
   another substrate that is stacked on the substrate.

6. The electronic device according to claim 1, wherein the substrate is a semiconductor substrate.

7. The electronic device according to claim 1, wherein the substrate is an insulating substrate.

8. The electronic device according to claim 1, wherein the substrate is a silicon substrate, and
   the first penetrating electrode includes a copper layer.

9. The electronic device according to claim 1, wherein the first penetrating electrode is in contact with the first electrode at a temperature less than a certain temperature and is away from the first electrode at a temperature equal to or greater than the certain temperature.

10. An electronic device comprising:
    a substrate that includes a first penetration hole;
    a first electrode that is formed on a first surface of the substrate and covers the first penetration hole;
    a first penetrating electrode that is formed in the first penetration hole and is in contact with or away from the first electrode depending on temperature, and
    a detection circuit configured to detect whether the first penetrating electrode is in contact with or away from the first electrode,
    wherein
    the first electrode comprising:
    a first layer, which is to be in contact with the first penetrating electrode, having a melting point greater than a melting point of the first penetrating electrode; and
    a second layer being formed on the first layer, having a resistivity lower than a resistivity of the first layer and having a melting point less than a melting point of the first layer.

11. An electronic device comprising:
    a substrate that includes a first penetration hole;
    a first electrode that is formed on a first surface of the substrate and covers the first penetration hole;
    a first penetrating electrode that is formed in the first penetration hole and is in contact with or away from the first electrode depending on temperature, and
    a detection circuit configured to detect whether the first penetrating electrode is in contact with or away from the first electrode,
    wherein
    a face along which the first electrode and the first penetrating electrode are in contact with each other bends outward so that a center of the face is located further out than the first surface of the substrate.

12. An electronic device comprising:
a substrate that includes a first penetration hole;
a first electrode that is formed on a first surface of the substrate and covers the first penetration hole;
a first penetrating electrode that is formed in the first penetration hole and is in contact with or away from the first electrode depending on temperature, and
a detection circuit configured to detect whether the first penetrating electrode is in contact with or away from the first electrode,
wherein the substrate is an insulating substrate.

* * * * *